(12) United States Patent
Kim

(10) Patent No.: US 8,395,964 B2
(45) Date of Patent: Mar. 12, 2013

(54) ROW ADDRESS DECODER AND SEMICONDUCTOR MEMORY DEVICE HAVING THE SAME

(75) Inventor: Gyung Tae Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 13/309,818

(22) Filed: Dec. 2, 2011

(65) Prior Publication Data

US 2012/0075942 A1    Mar. 29, 2012

Related U.S. Application Data

(62) Division of application No. 12/344,841, filed on Dec. 29, 2008, now Pat. No. 8,072,835.

(30) Foreign Application Priority Data

Jun. 4, 2008    (KR) .................. 10-2008-0052704

(51) Int. Cl.
*G11C 8/00*    (2006.01)

(52) U.S. Cl. .............. 365/230.06; 365/201; 365/185.12; 365/185.13; 365/230.01

(58) Field of Classification Search .................. 365/201, 365/185.12, 185.13, 230.06, 230.01
See application file for complete search history.

(56) References Cited

U.S. PATENT DOCUMENTS

| 6,377,498 | B1 * | 4/2002 | Kang | ............................ 365/200 |
| 7,151,713 | B2 | 12/2006 | Nakazawa | |
| 2008/0094890 | A1 | 4/2008 | Kim et al. | |
| 2009/0097344 | A1 | 4/2009 | Park | |
| 2010/0309739 | A1 | 12/2010 | An | |

FOREIGN PATENT DOCUMENTS

| JP | 2001-229695 A | 8/2001 |
| JP | 2003-346497 A | 12/2003 |
| KR | 10-0287191 B1 | 1/2001 |
| KR | 1020020059916 A | 7/2002 |
| KR | 1020040054362 A | 6/2004 |
| KR | 1020050098336 A | 10/2005 |

OTHER PUBLICATIONS

USPTO RR mailed Jan. 3, 2011 in connection with U.S. Appl. No. 12/344,841.
USPTO NFOA mailed Mar. 3, 2011 in connection with U.S. Appl. No. 12/344,841.
USPTO NOA mailed Aug. 4, 2011 in connection with U.S. Appl. No. 12/344,841.

* cited by examiner

*Primary Examiner* — Vu Le
*Assistant Examiner* — Han Yang
(74) *Attorney, Agent, or Firm* — Ladas & Parry LLP

(57) ABSTRACT

A row address decoder includes a first main word line decoding unit decoding first and second row addresses to generate first to fourth main decoding signals. When a data storage test is performed, the first to fourth main decoding signals are enabled at first to fourth timings, respectively. The row address decoder also includes a second main word line decoding unit decoding third and fourth row addresses to generate fifth to eighth main decoding signals. When a data storage test is performed, the fifth to eight to main decoding signals are enabled at first to fourth timings, respectively. A main word line enable signal generating unit decodes the first to fourth main decoding signals and the fifth to eighth main decoding signals to generate first to sixteenth main word line enable signals that are enabled at different times.

6 Claims, 3 Drawing Sheets

ROW ADDRESS DECODER AND SEMICONDUCTOR MEMORY DEVICE HAVING THE SAME

CROSS-REFERENCES TO RELATED APPLICATION

The present application claims priority under 35 U.S.C. 119(a) to Korean patent application number 10-2008-0052704, filed on Jun. 4, 2008, in the Korean Patent Office, which is incorporated herein by reference in its entirety.

BACKGROUND OF THE INVENTION

The present invention relates generally to a semiconductor memory apparatus, and more particularly, to a row address decoder and a semiconductor memory apparatus having the same.

A typical dynamic random access memory (DRAM) stores data in a large number of memory cells, with each memory cell having a transistor and a capacitor. Each memory cell is connected to a word line and a bit line where the word line and bit line intersect. When a word line is activated, each memory cell receives data from the bit line or outputs data to the bit line. The word line is divided into a main word line and a sub-word line. A single main word line is connected to a plurality of preset sub-word line drivers (e.g. eight sub-word line drivers). These sub-word line drivers are respectively connected to the sub-word lines. Each sub-word line is directly connected to a plurality of memory cells.

In order to activate the main word line and the sub-word line, the semiconductor memory apparatus includes a row address decoder. The row address decoder decodes a plurality of externally received row addresses. At this time, some of the row addresses (generally, six row addresses) are input into the row address decoder and are used to activate the main word lines (here, 64 main word lines), and the remaining row addresses (generally, three row addresses) are used to activate the main word lines (here, 8 main word lines).

A typical semiconductor memory apparatus requires a test process for testing and guaranteeing the quality of the device after it is designed. During this test process, the data storage capability of the memory cells is also tested. Typically, the data storage capability of the memory cells is tested by: inputting data corresponding to a first logic value (e.g. '1') into all of the memory cells, activating a quarter of the sub-word lines (e.g. if there are 512 sub-word lines 128 of the sub-word lines are activated), inputting data corresponding to a second logic value (e.g. '0') into the activated sub-word lines, and determining whether or not the stored data is lost, which may be caused by the influence of coupling noise, or the like.

However, when the data storage capability of the memory cells is tested according to the method just described, each of the very large number of sub-word lines is activated at the same time, and thus an extensive peak current results. As a consequence, the sub-word line driver realizes a reduction in its ability to drive the sub-word line. For this reason, there is a possibility of an error occurring in the test itself, which results in the test having a reduced reliability. In other words, conventional tests for determining the data storage capability of memory cells have a possibility of failure.

SUMMARY

Embodiments of the present invention include a row address decoder capable of reducing the intensity of peak current during a data storage test to thereby prevent malfunction, and a semiconductor memory apparatus having the same.

According to one aspect, a row address decoder includes a first main word line decoding unit configured to decode first and second row addresses to generate first to fourth main decoding signals enabled at first to fourth timings, respectively, when a data storage test is performed, a second main word line decoding unit configured to decode third and fourth row addresses to generate fifth to eighth main decoding signals enabled at the first to fourth timings, respectively, when the data storage test is performed, and a main word line enable signal generating unit configured to decode the first to fourth main decoding signals and the fifth to eighth main decoding signals to generate first to sixteenth main word line enable signals.

According to another aspect, a semiconductor memory apparatus includes a row address decoder configured to decode a plurality of row addresses to enable first and second main word line enable signals at respective first and second timings when a data storage test is performed, a first main word line driver configured to activate a first main word line connected to a plurality of first sub-word line drivers in response to the first main word line enable signal, and a second main word line driver configured to activate a second main word line connected to a plurality of second sub-word line drivers in response to the second main word line enable signal.

According to yet another aspect, a row address decoder includes a main word line decoding unit configured to decode row addresses to generate a plurality of main decoding signals having different enable timings in response to a data storage test signal, and a main word line enable signal generating unit configured to receive the main decoding signals to generate a plurality of main word line enable signals.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
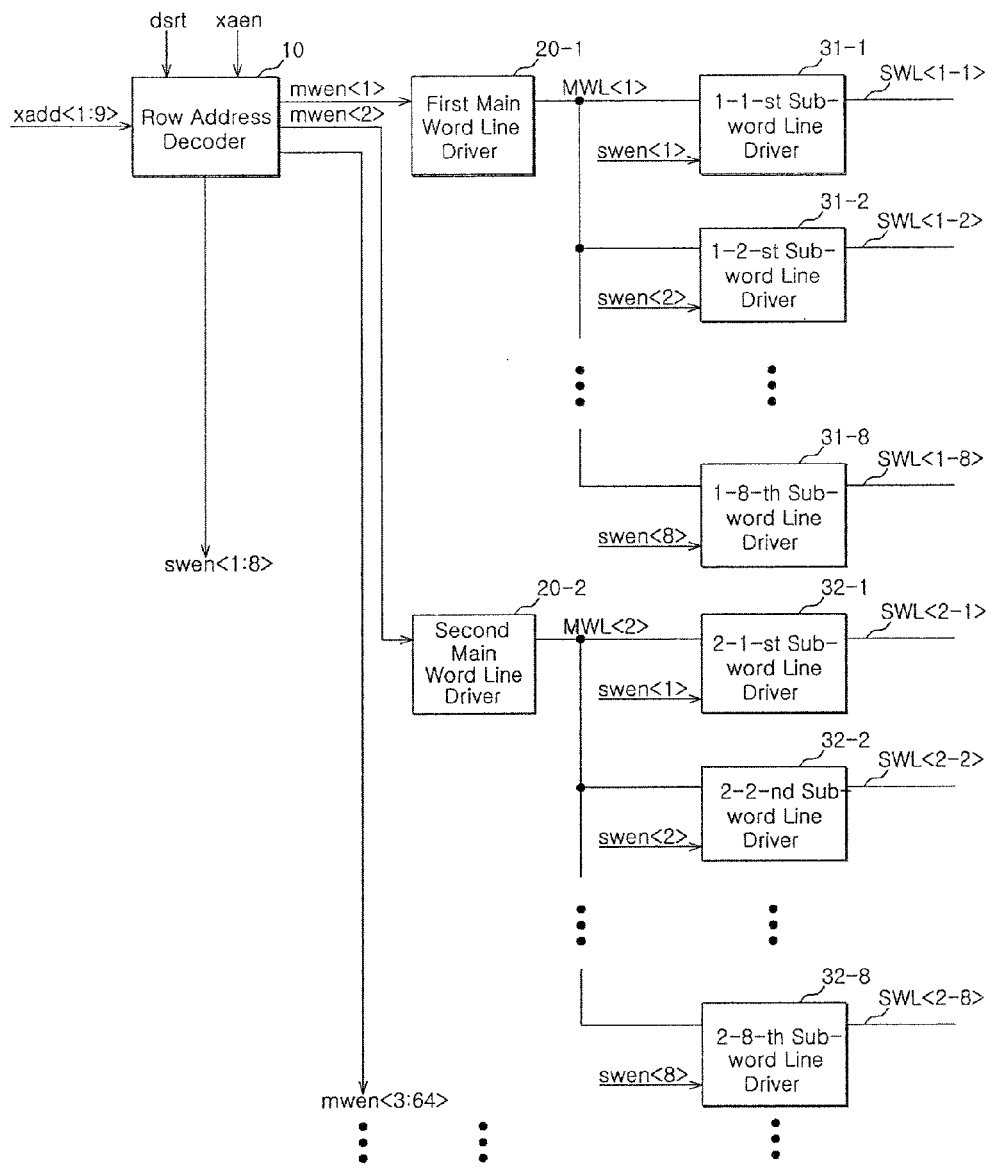
FIG. 1 is a block diagram showing an example of a semiconductor memory apparatus according to an embodiment of the present invention.

Referring to FIG. 1, the semiconductor memory apparatus according to an embodiment of the present invention includes a row address decoder 10, a first main word line driver 20-1, and a second main word line driver 20-2 (the third main word line driver on is not shown in detail).

The row address decoder 10 is configured to decode first to ninth row addresses 'xadd<1:9>' in response to a data storage test signal 'dsrt' and a row address enable signal 'xaen' in order to generating 1-st to 64-th main word line enable signals 'mwen<1:64>' and first to eighth sub-word line enable signals 'swen<1:8>'.

The first main word line driver 20-1 is configured to activate a first main word line 'MWL<1>' in response to the first main word line enable signal 'mwen<1>'.

The second main word line driver 20-2 activates a second main word line 'MWL<2>' in response to the second main word line enable signal 'mwen<2>'.

More specifically, in an embodiment of the present invention, the first main word line driver 20-1 is connected to 1-1-st to 1-8-th sub-word line drivers 31-1 to 31-8 through the first main word line 'MWL<1>'. The 1-1-st to 1-8-th sub-word line drivers 31-1 to 31-8 respectively activate corresponding sub-word lines 'SWL<1-1> to SWL<1-8>' according to whether or not the respective sub-word line enable signals 'swen<1:8>' and the first main word line 'MWL<1>' are activated. Similarly, the second main word line driver 20-2 may be connected to 2-1-st to 2-8-th sub-word line drivers 32-1 to 32-8 through the second main word line 'MWL<2>'. The 2-1-st to 2-8-th sub-word line drivers 32-1 to 32-8 respectively activate corresponding sub-word lines 'SWL<2-1> to SWL<2-8>' according to whether or not the respective sub-word line enable signals 'swen<1:8>' and the second main word line 'MWL<2>' are activated.

Although not shown, the semiconductor memory apparatus may further include 62 additional main word line drivers receiving 3-rd to 64-th main word line enable signals 'mwen<3:64>', respectively, and 496 additional sub-word lines, eight of which are connected to each main word line driver.

The row address decoder 10 starts to decode the first to ninth row addresses 'xadd<1:9>' when the row address enable signal 'xaen' is enabled. Here, among the first to ninth row addresses 'xadd<1:9>', the first to third row addresses 'xadd<1:3>' are decoded in order to generate the first to eighth sub-word line enable signals 'swen<1:8>', and the fourth to ninth row addresses 'xadd<4:9>' are decoded in order to generate the 1-st to 64-th main word line enable signals 'mwen<1:64>'. The row address decoder 10 performs the data storage test only to the third row address 'xadd<3>' when decoding the first to third row addresses 'xadd<1:3>'. Thus, the data storage test is applied to only two of the first to eighth sub-word line enable signals 'swen<1:8>' which are generated by the first to third row addresses 'xadd<1:3>'. As a result, among all the sub-word lines, only a quarter are activated during the data storage test.

When performing the data storage test, the row address decoder 10 enables all of the 1-st to 64-th main word line enable signals 'mwen<1:64>' before completion of the test. However, the row address decoder 10 controls the 1-st to 64-th main word line enable signals 'mwen<1:64>' in such a manner that all of the 1-st to 64-th main word line enable signals 'mwen<1:64>' are not enabled at the same time, and instead, a predetermined number of the 1-st to 64-th main world line enable singles are enabled at different times. That is, each of the 64 main word lines are eventually enabled during the data storage test, but the enablement of the world line enable signals is spaced out into different time intervals, so that the world line enable signals 'mwen<1:64>' are never enabled at the same time, thereby preventing the high intensity peak current. According to embodiments of the present invention, the data test can be free from malfunction (which, as described above, is caused by the simultaneous activation of a great number of main word lines) when the row address decoder 10 is realized in this way, which in turn leads to a more stable test performance.

Figure 2:
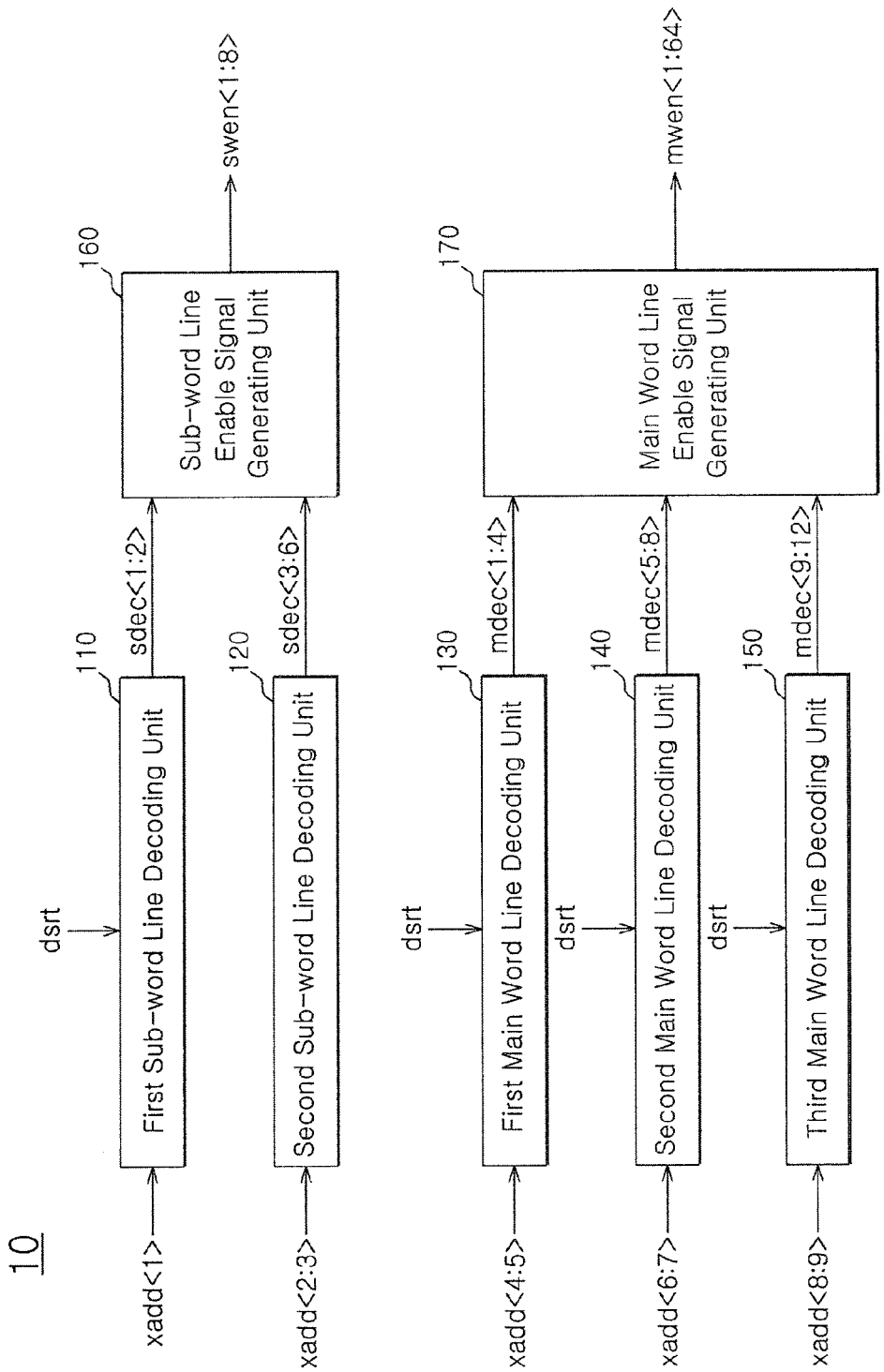
FIG. 2 is a detailed view showing an embodiment of the row address decoder shown in FIG. 1.

FIG. 2 is a detailed view showing an embodiment of the row address decoder 10 shown in FIG. 1.

As shown, the row address decoder 10 according to an embodiment of the present invention includes a first sub-word line decoding unit 110, a second sub-word line decoding unit 120, a first main word line decoding unit 130, a second main word line decoding unit 140, a third main word line decoding unit 150, a sub-word line enable signal generating unit 160, and a main word line enable signal generating unit 170.

The first sub-word line decoding unit 110 decodes the first row address 'xadd<1>' in response to the data storage test signal 'dsrt' in order to generate first and second sub-decoding signals 'sdec<1:2>'.

The second sub-word line decoding unit 120 decodes the second and third row addresses 'xadd<2:3>' in response to the data storage test signal 'dsrt' in order to generate third to sixth sub-decoding signals 'sdec<3:6>'.

The first main word line decoding unit 130 decodes the fourth and fifth row addresses 'xadd<4:5>' in response to the data storage test signal 'dsrt' in order generate first to fourth main decoding signals 'mdec<1:4>'.

The second main word line decoding unit 140 decodes the sixth and seventh row addresses 'xadd<6:7>' in response to the data storage test signal 'dsrt' in order to generate fifth to eighth main decoding signals 'mdec<5:8>'.

The third main word line decoding unit 150 decodes the eighth and ninth row addresses 'xadd<8:9>' in response to the data storage test signal 'dsrt' in order to generate ninth to twelfth main decoding signals 'mdec<9:12>'.

The sub-word line enable signal generating unit 160 decodes the first to sixth sub-decoding signals 'sdec<1:6>' in order to generate the first to eighth sub-word line enable signals 'swen<1:8>'.

The main word line enable signal generating unit 170 decodes the first to twelfth main decoding signals 'mdec<1:12>' in order to generate the 1-st to 64-th main word line enable signals 'mwen<1:64>'.

As described above, the data storage test signal 'dsrt' is input into the first sub-word line decoding unit 110 only. Thus, among the first to eighth sub-word line enable signals 'swen<1:8>' generated by the sub-word line enable signal generating unit 160, only two are activated in the event of a data storage test. The first sub-word line decoding unit 110, the second sub-word line decoding unit 120, and the sub-word line enable signal generating unit 160 (all of which perform this data storage test) have an ordinary configuration, which can be carried out by a person skilled in the art.

In the event of a data storage test, the first to third main word line decoding units 130 to 150 decode the fourth and fifth row addresses 'xadd<4:5>', the sixth and seventh row addresses 'xadd<6:7>', and the eighth and ninth row addresses 'xadd<8:9>', respectively, in order to generate the first to fourth main decoding signals 'mdec<1:4>', the fifth to eighth main decoding signals 'mdec<5:8>', and the ninth to twelfth main decoding signals 'mdec<9:12>', respectively. At this time, the first, fifth and ninth main decoding signals 'mdec<1,5,9>' are output at a first timing; and the second, sixth and tenth main decoding signals 'mdec<2,6,10>' are output at a second timing. Further, the third, seventh and eleventh main decoding signals 'mdec<3,7,11>' are output at a third timing; and the fourth, eighth and twelfth main decoding signals 'mdec<4,8,12>' are output at a fourth timing. In an embodiment of the present invention, the first to fourth timings are different from each other.

A predetermined number of the 1-st to 64-th main word line enable signals 'mwen<1:64>', which are generated by the main word line enable signal generating unit 170 according to the operation of the first to third main decoding unit 130 to 150 during the data storage test, are enabled at different times. Thus, the 64 main word lines cannot be enabled at the same time.

Herein, the first to twelfth main decoding signals 'mdec<1: 12>' are shown to be output in the aforementioned fashion. According to the circumstances, it is also possible for the first to fourth main decoding signals 'mdec<1:4>' may be output at a first timing, and the fifth to eighth main decoding signals 'mdec<5:8>' may be output at a second timing. Further, the ninth to twelfth main decoding signals 'mdec<9:12>' may be output at a third timing. In other words, according to an embodiment of the present invention, the row address decoder 10 is configured so that the first to twelfth main decoding signals 'mdec<1:12>' are not enabled at the same time, and thereby the reliability of the data storage test is improved.

Figure 3:
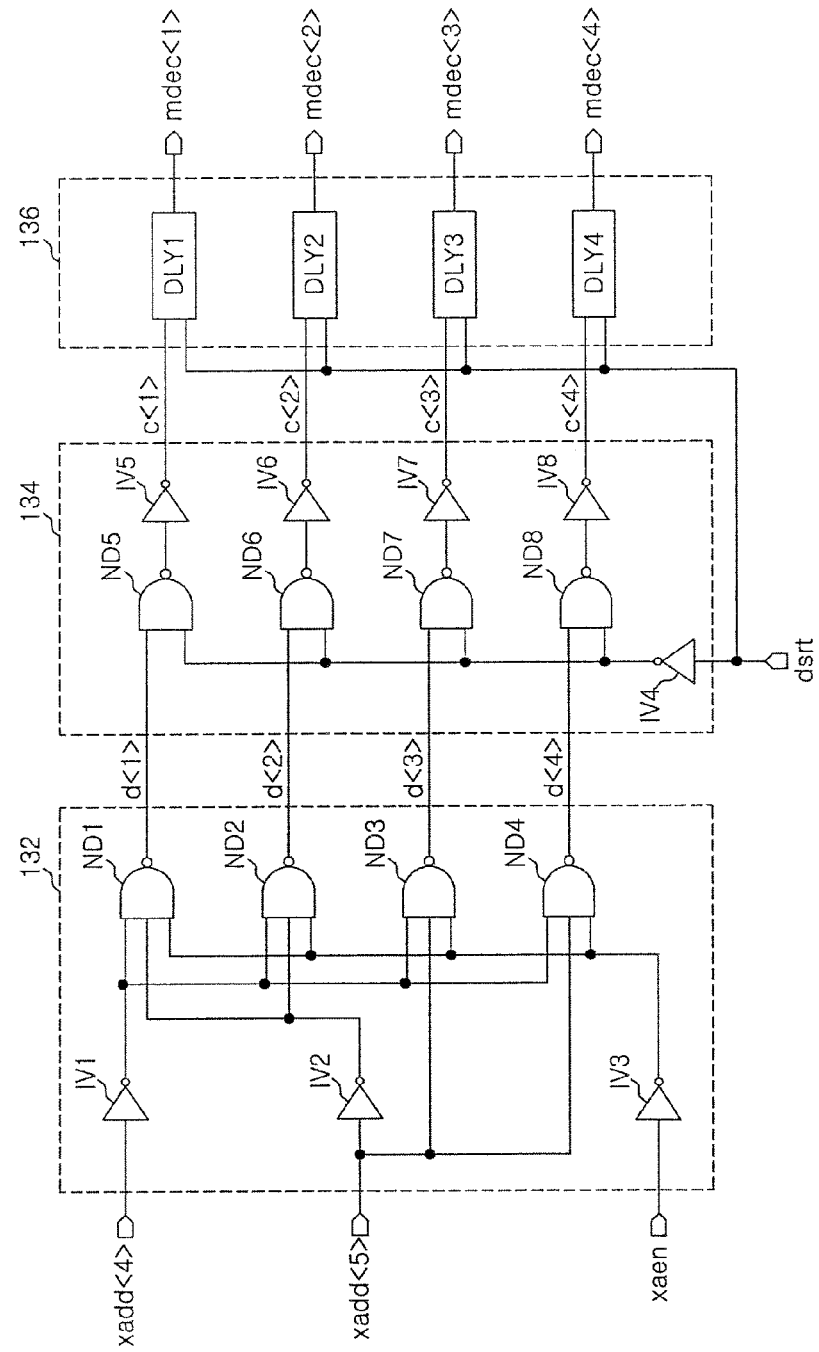
FIG. 3 is a detailed view showing an embodiment of the first word line decoding unit shown in FIG. 2.

FIG. 3 is a detailed view showing an example of the first main word line decoding unit illustrated in FIG. 2.

The first to third main word line decoding units 130 to 150 are each configured in a substantially similar structure, with one different being that they input/output different signals. As such, only the configuration of the first main word line decoding unit 130 will be described. Nevertheless, the configuration of the second and third main word line decoding units 140 and 150 can be understood from the description of the first main word line decoding unit 130.

Referring to FIG. 3, the first main word line decoding unit 130 may include a decoding unit 132 decoding the fourth and fifth row addresses 'xadd<4:5>' in response to the row address enable signal 'xaen' in order to generate first to fourth decoding signals 'd<1:4>'; a combination unit 134 combining the data storage test signal 'dsrt' with the first to fourth decoding signals 'd<1:4>' in order to generate first to fourth combination signals 'c<1:4>', and a delay unit 136 delaying the first to fourth combination signals 'c<1:4>' in response to the data storage test signal 'dsrt' in order to generate the first to fourth main decoding signals 'mdec<1:4>'.

The decoding unit 132 in the embodiment of the present invention shown in FIG. 3 includes a first inverter 'IV1' receiving the fourth row address 'xadd<4>'; a second inverter 'IV2' receiving the fifth row address 'xadd<5>'; a third inverter 'IV3' receiving the row address enable signal 'xaen'; a first NAND gate 'ND1' receiving output signals of the first, second and third inverters 'IV1', 'IV2' and 'IV3' to output the first decoding signal 'd<1>'; a second NAND gate 'ND2' receiving the fourth row address 'xadd<4>' and the output signals of the second and third inverters 'IV2' and 'IV3' to output the second decoding signal 'd<2>'; a third NAND gate 'ND3' receiving the output signal of the first inverter 'IV1', the fifth row address 'xadd<5>' and the output signal of the third inverter 'IV3' to output the third decoding signal 'd<3>'; and a fourth NAND gate 'ND4' receiving the fourth row address 'xadd<4>', the fifth row address 'xadd<5>' and the output signal of the third inverter 'IV3' to output the fourth decoding signal 'd<4>'.

The combination unit 134 according to the embodiment of the present invention shown in FIG. 3 includes a fourth inverter 'IV4' receiving the data storage test signal 'dsrt', a fifth NAND gate 'ND5' receiving the first decoding signal 'd<1>' and the output signal of the fourth inverter 'IV4'; a fifth inverter 'IV5' receiving the output signal of the fifth NAND gate 'ND5' to output the first combination signal 'c<1>'; a sixth NAND gate 'ND6' receiving the second decoding signal 'd<2>' and the output signal of the fourth inverter 'IV4'; a sixth inverter 'IV6' receiving the output signal of the sixth NAND gate 'ND6' to output the second combination signal 'c<2>'; a seventh NAND gate 'ND7' receiving the third decoding signal 'd<3>' and the output signal of the fourth inverter 'IV4'; a seventh inverter 'IV7' receiving the output signal of the seventh NAND gate 'ND7' to output the third combination signal 'c<3>'; an eighth NAND gate 'ND8' receiving the fourth decoding signal 'd<4>' and the output signal of the fourth inverter 'IV4'; and an eighth inverter 'IV8' receiving the output signal of the eighth NAND gate 'ND8' to output the fourth combination signal 'c<4>'.

The delay unit 136 according to an embodiment of the present invention shown in FIG. 3 includes a first delayer 'DLY1' delaying the first combination signal 'c<1>' in response to the data storage test signal 'dsrt' in order to output the first main decoding signal 'mdec<1>', a second delayer 'DLY2' delaying the second combination signal 'c<2>' in response to the data storage test signal 'dsrt' in order to output the second main decoding signal 'mdec<2>', a third delayer 'DLY3' delaying the third combination signal 'c<3>' in response to the data storage test signal 'dsrt' in order to output the third main decoding signal 'mdec<3>', and a fourth delayer 'DLY4' delaying the fourth combination signal 'c<4>' in response to the data storage test signal 'dsrt' in order to output the fourth main decoding signal 'mdec<4>'.

The first to fourth delayers 'DLY1' to 'DLY4' are configured to allocate different delay times when the data storage test signal 'dsrt' is disabled and enabled. In detail, when the data storage test signal 'dsrt' is disabled, the first to fourth delayers 'DLY1' to 'DLY4' allocate the same delay time to each of the first to fourth combination signals 'c<1:4>'. Conversely, when the data storage test signal 'dsrt' is enabled, the first delayer 'DLY1' delays the first combination signal 'c<1>' by a first time, the second delayer 'DLY2' delays the second combination signal 'c<2>' by a second time, the third delayer 'DLY3' delays the third combination signal 'c<3>' by a third time, and the fourth delayer 'DLY4' delays the fourth combination signal 'c<4>' by a fourth time. Here, the first to fourth times are different from each other. For example, the first to fourth times may be 5 ns, 10 ns, 15 ns and 20 ns, respectively, so that the first to fourth main decoding signals mdec<1:4> are not output at the same time.

The row address enable signal 'xaen' is realized as being enabled when at a low level. The first main word line decoding unit 130 begins to operate when the row address enable signal 'xaen' is enabled.

The decoding unit 132 decodes the fourth and fifth row addresses 'xadd<4:5>' to generate the first to fourth decoding signals 'd<1:4>', only one of which has a low-level voltage.

During normal operation, the data storage test signal 'dsrt' is not enabled, so that the first to fourth decoding signals 'd<1:4>' are output as the first to fourth combination signals 'c<1:4>' through the combination unit 134. The first to fourth combination signals 'c<1:4>' are delayed at the delay unit 136, and are then output as the first to fourth main decoding signals 'mdec<1:4>'. During normal operation, each of the first to fourth main decoding signals 'mdec<1:4>' have the same output timing since the data storage test signal 'dsrt' is disabled, and only one of the first to fourth main decoding signals 'mdec<1:4>' has a low-level voltage.

Conversely, in the event of a data storage test, the data storage test signal 'dsrt' is enabled, and each of the first to fourth combination signals 'c<1:4>' have the same low-level voltage. After the first to fourth combination signals 'c<1:4>' are output from the combination unit 134, the first to fourth combination signals 'c<1:4>' are delayed by different amounts through the delay unit 136. Thus, the first to fourth main decoding signals 'mdec<1:4>', all of which have the low-level voltage, are output at different timings.

In an embodiment of the present invention, the second and third main word line decoding unit 140 and 150 have the same configuration as that of the first main word line decoding unit 130, and thus operate according to the aforementioned process.

Additionally, as described above, the row address decoder 10 can be configured so that the first to fourth main decoding signals 'mdec<1:4>' are output at first timing, so that the fifth to eighth main decoding signals 'mdec<5:8>' are output at second timing, and so that the ninth to twelfth main decoding signals 'mdec<9:12>' are output at third timing. In this embodiment, the first to fourth delayers 'DLY1' to 'DLY4' of the delay unit 136 have the same delay value regardless of whether or not the data storage test signal 'dsrt' is enabled. At this time, the first to fourth delayers 'DLY1' to 'DLY4' of the delay unit 136 must have a different delay value than that of the delayers of the delay units of each of the second and third main word line decoding unit 140 and 150.

As described above, the row address decoder (and also the semiconductor memory apparatus having the same) generates main word line decoding signals that are output at different times (i.e., are output at different timings) when the data storage test signal is enabled, and decodes the generated signals again to thereby generate the main word line enable signals (which are great in number). Thus, a predetermined number of the numerous main word line enable signals are enabled at a time that is different from another predetermined number of main word line enable signals, so that there is a time difference between the groups of enabled main word line enable signals. As such, the row address decoder and the semiconductor memory apparatus having the same do not suffer from malfunction caused by the simultaneous activation of each of the great number of main word lines, and thereby, the reliability of a data storage test can be improved.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. A semiconductor memory apparatus comprising:
   a row address decoder configured to decode a plurality of row addresses to enable a first main word line enable signal at a first timing and a second main word line enable signal at a second timing when a data storage test is performed;
   a first main word line driver configured to activate a first main word line connected to a plurality of first sub-word line drivers in response to the first main word line enable signal; and
   a second main word line driver configured to activate a second main word line connected to a plurality of second sub-word line drivers in response to the second main word line enable signal.

2. The semiconductor memory apparatus of claim 1, wherein the row address decoder comprises:
   a first main word line decoding unit configured to receive and decode first row addresses of the plurality of row addresses to generate a first main decoding signal enabled at a first timing when the data storage test is performed;
   a second main word line decoding unit configured to receive second row addresses of the plurality of row addresses to generate a second main decoding signal enabled at a second timing that is different from the first timing; and
   a main word line enable signal generating unit configured to decode the first and second main decoding signals to generate the first and second main word line enable signals.

3. The semiconductor memory apparatus of claim 2, wherein the first main word line decoding unit includes:
   a first decoding unit configured to decode the first row addresses of the plurality of row addresses in response to a row address enable signal to generate a first decoding signal;
   a first combination unit configured to combine a data storage test signal with the first decoding signal to generate a first combination signal; and
   a first delay unit configured to delay the first combination signal in response to the data storage test signal to generate the first main decoding signal.

4. The semiconductor memory apparatus of claim 3, wherein the second main word line decoding unit comprises:
   a second decoding unit configured to decode the second row addresses of the plurality of row addresses in response to the row address enable signal to generate a second decoding signal;
   a second combination unit configured to combine the data storage test signal with the second decoding signal to generate a second combination signal; and
   a second delay unit configured to delay the second combination signal in response to the data storage test signal to generate the second main decoding signal.

5. The semiconductor memory apparatus of claim 4, wherein the first and second delay units are configured to have different delay values when the data storage test signal is enabled, and are configured to have the same delay values when the data storage test signal is disabled.

6. The semiconductor memory apparatus of claim 1, wherein the main word line begins activation at a timing different from that of the second main word line when the data storage test is performed.

* * * * *